(12) United States Patent
Nagase et al.

(10) Patent No.: US 9,233,347 B2
(45) Date of Patent: Jan. 12, 2016

(54) MIXED GAS SUPPLY DEVICE

(75) Inventors: Masaaki Nagase, Osaka (JP); Ryousuke Dohi, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 428 days.

(21) Appl. No.: 13/520,824

(22) PCT Filed: Oct. 22, 2010

(86) PCT No.: PCT/JP2010/006261
§ 371 (c)(1),
(2), (4) Date: Oct. 1, 2012

(87) PCT Pub. No.: WO2011/101934
PCT Pub. Date: Aug. 25, 2011

(65) Prior Publication Data
US 2013/0025718 A1   Jan. 31, 2013

(30) Foreign Application Priority Data
Feb. 22, 2010   (JP) ................................ 2010-035762

(51) Int. Cl.
*F16K 11/20*   (2006.01)
*B01J 4/02*   (2006.01)
(Continued)

(52) U.S. Cl.
CPC ............... *B01J 4/02* (2013.01); *G05D 11/132* (2013.01); *H01L 21/67017* (2013.01); *Y10T 137/87249* (2015.04)

(58) Field of Classification Search
CPC ...... G05D 11/132; G05D 7/0635; F17D 1/04; F16K 27/003; G01F 1/36; B01J 4/02

USPC .......................... 137/597, 606, 897, 605, 504
See application file for complete search history.

(56) References Cited

U.S. PATENT DOCUMENTS

| | | |
|---|---|---|
| 5,308,433 A | 5/1994 | Otsuka et al. |
| 5,494,521 A | 2/1996 | Otsuka et al. |

(Continued)

FOREIGN PATENT DOCUMENTS

| | | |
|---|---|---|
| JP | 5-94956 A | 4/1993 |
| JP | 9-283504 A | 10/1997 |

(Continued)

OTHER PUBLICATIONS

Machine Translation of JP3387777 (of corresponding publication JP11-2400) from EPO worldwide.espacenet.com website Sep. 16, 2014.*

*Primary Examiner* — Jessica Cahill
(74) *Attorney, Agent, or Firm* — Griffin and Szipl PC

(57) ABSTRACT

A mixed gas supply device includes a plurality of gas supply lines arranged in parallel that include flow rate control devices and outlet side switching valves, wherein gas outlets of respective outlet side switching valves communicate with a manifold, and another gas supply line at a position close to a mixed gas outlet of the manifold supplies a low flow rate gas, wherein an outlet side of the flow rate control device and an inlet side of the outlet side switching valve are hermetically connected via an outlet side connecting fitting of the flow rate control device and a mounting table having a gas passage, wherein a small hole portion is provided at a part of a flow passage at the outlet side connecting fitting and/or a flow passage, which makes the outlet side switching valve and a mixed gas flow passage in the manifold communicate with one another.

15 Claims, 11 Drawing Sheets

(51) Int. Cl.
   *G05D 11/13* (2006.01)
   *H01L 21/67* (2006.01)

(56) References Cited

U.S. PATENT DOCUMENTS

| | | | |
|---|---|---|---|
| 5,950,675 A | 9/1999 | Minami et al. | |
| 6,210,482 B1 | 4/2001 | Kitayama et al. | |
| 6,360,762 B2* | 3/2002 | Kitayama et al. | 137/1 |
| 6,394,138 B1* | 5/2002 | Vu et al. | 137/884 |
| 7,152,629 B2* | 12/2006 | Tokuda et al. | 137/884 |
| 7,192,486 B2* | 3/2007 | Bang et al. | 118/715 |
| 2001/0013363 A1 | 8/2001 | Kitayama et al. | |
| 2009/0059717 A1* | 3/2009 | Itoh et al. | 366/152.2 |
| 2009/0171507 A1 | 7/2009 | Ohmi et al. | |
| 2010/0096031 A1 | 4/2010 | Okase et al. | |
| 2010/0139775 A1 | 6/2010 | Ohmi et al. | |

FOREIGN PATENT DOCUMENTS

| | | |
|---|---|---|
| JP | 11-2400 A | 1/1999 |
| JP | 2000-323464 A | 11/2000 |
| JP | 3387777 B2 | 1/2003 |
| JP | 2003-86579 A | 3/2003 |
| JP | 3442604 B2 | 6/2003 |
| JP | 2007-4644 A | 1/2007 |
| JP | 2007-7644 A | 1/2007 |
| JP | 2007-57474 A | 3/2007 |
| JP | 4137267 B2 | 6/2008 |
| WO | 2008149702 A1 | 11/2008 |

* cited by examiner

US 9,233,347 B2

MIXED GAS SUPPLY DEVICE

This is a National Phase Application in the United States of International Patent Application No. PCT/JP2010/006261 filed Oct. 22, 2010, which claims priority on Japanese Patent Application No. 2010-035762, filed Feb. 22, 2010. The entire disclosures of the above patent applications are hereby incorporated by reference.

TECHNICAL FIELD OF THE INVENTION

The present invention relates to improvement of a mixed gas supply device for a semiconductor manufacturing apparatus. Specifically, the present invention relates to a mixed gas supply device that is configured to be capable of rapidly switching among a plurality of gases to supply those without causing backflow or back-diffusion thereof, which makes it possible to shorten a process time, decrease a gas loss, and downsize a mixed gas manufacturing apparatus.

BACKGROUND OF THE INVENTION (BACKGROUND ART)

In recent years, in the field of a semiconductor manufacturing apparatus, downsizing of the apparatus, lowering of manufacturing cost, improvement in product quality, and the like, have been strongly demanded. In order to respond to those requirements, the development of an integrated processing apparatus that continuously carries out oxide film processing and polysilicon film processing, with respect to a wafer, has been proposed as a semiconductor manufacturing apparatus for the next generation.

However, in such an integrated processing apparatus, gaseous species to be supplied include thirty types of gases, which are varied in character, that is, in addition to gaseous species for etching in oxide film processing, corrosive gaseous species, such as HBr and C, as well are to be included in the gaseous species supplied. Therefore, prevention of backflow and back-diffusion in so-called switching between gaseous species, and improvement in the rate of gas utilization due to gas displacement at high speed, have grown to become more important matters.

Additionally, the applicant for the present patent has thus far developed many technologies relating to prevention of backflow and back-diffusion in switching of gaseous species to be supplied, such as those technologies disclosed below.

For example, Japanese Patent No. 3442604 shows an example thereof. As shown in FIG. 18, in the case where a plurality of gaseous species $G_1$ to $G_n$ to be supplied are switched by operating switching valves $V_1$ to $V_n$, with (1) the supply line $L_n$ of gaseous species at a minimum flow rate, which is disposed at a position most distant from a gas-out portion Go, (2) orifices $S_1$ to $S_n$ are provided to make the ratios between the passage areas of the respective lines $L_1$ to $L_n$ and the gas flow rates of the respective lines constant, or (3) a valve having an orifice OL built-in as shown in FIG. 19 is used as the switching valve $V_n$ of the minimum flow rate line $L_n$. In order to increase a flow velocity of the gaseous species at the minimum flow rate, an attempt is made to prevent backflow and back-diffusion of another gas caused at the time of changing gaseous species by switching the switching valves $V_1$ to $V_n$. For example, at the time of changing a gaseous species from the gas $G_3$ to the gas $G_1$ by simultaneously operating the switching valve $V_3$ from open to close and the switching valve $V_1$ from close to open, the gas $G_1$ is prevented from flowing back to the upstream side of the switching valve $V_3$.

Furthermore, Japanese Patent No. 3,387,777 is the invention in which all the switching valves $V_1$ to $V_n$ of FIG. 18 are orifice built-in type valves having a configuration as in FIG. 19, in which ratios of gas flow rates between the flow passage cross-sectional areas of the respective lines $L_1$ to $L_n$ of the respective gaseous species $G_1$ to $G_n$ and the gas flow rates of the respective lines $L_1$ to $L_n$ are made constant by changing the calibers of the orifices built in the respective switching valves $V_1$ to $V_n$, to prevent backflow and back-diffusion caused by switching operations of the switching valves $V_1$ to $V_n$. In FIG. 18, MFC denotes a thermal type flow rate control device, F denotes a filter, and RG denotes a pressure regulator.

In addition, it has been well-known that when an orifice is interposed in a flow passage, orifice built-in type valves are used, or a gasket type orifice is used as an orifice in a gas flow rate control device. However, a configuration in which orifices, or orifice built-in type valves, are used with the goal to prevent a high flow rate gas from flowing back and back-diffusing to the inside of a low flow rate gas line, in operation of the switching valves in a mixed gas supply device in which a plurality of gas supply lines are connected in parallel, and a mixed gas from the respective gas supply lines is supplied to a gas using place through a manifold, is limited to Japanese Patent No. 3442604 and Japanese Patent No. 3,387,777.

PRIOR ART DOCUMENTS

Patent Document

Patent Document 1: Japanese Patent No. 3,387,777.
Patent Document 2: Japanese Patent No. 3,442,604.
Patent Document 3: Japanese Patent No. 4,137,267.
Patent Document 4: Japanese Published Unexamined Patent Application No. 2003-86579.
Patent Document 5: Japanese Published Unexamined Patent Application No. 2007-57474.
Patent Document 6: Japanese Published Unexamined Patent Application No. 2007-4644.
Patent Document 7: Japanese Published Unexamined Patent Application No. 2007-7644.

SUMMARY OF THE INVENTION

Problem to be Solved by the Invention

According to the technologies of Japanese Patent No. 3442604 and Japanese Patent No. 3,387,777, for example, at the time of opening and closing operations of the switching valves, it is possible to effectively prevent a gas of a high flow rate gas line from flowing back or back-diffusing to the primary side (the upstream side) of a switching valve of a low flow rate gas line, which has a beneficial practical effect. However, in the technologies of the above-described patent inventions, because it is fundamental in any one of the inventions that a low flow rate gas line is located on the upstream side of a high flow rate gas line (in a place more distant from the gas-out portion Go) with respect to a gas-out portion Go, in the case where there is a low flow rate of process gas, it takes a long time for gas displacement of a manifold portion joining the respective gas supply lines, which brings about the problem that it is impossible to significantly shorten a process time in semiconductor manufacturing in view of gas displacement.

A main object of the present invention is to provide a mixed gas supply device that is capable of effectively preventing backflow and back-diffusion of a gaseous species without the problem as described above as occurring in a conventional mixed gas supply device for a semiconductor manufacturing apparatus, that is, without locating a low flow rate gas supply line on the upstream side of a high flow rate gas supply line with respect to a gas-out portion Go, and that is additionally capable of improving the performance of gas displacement of a gas supply system, which includes a manifold portion, to significantly shorten a process processing time.

Means for Solving the Problem

In a mixed gas supply device for a semiconductor manufacturing apparatus, in order to speed up gas displacement thereof and to prevent back-diffusion of a gas in response to an increase in the number of gas supply lines, and growth in size of a shower plate, the inventors of the present invention first have confirmed a relationship between an orifice interposing position and an effect for preventing backflow and back-diffusion of a gas by an experiment, and next have confirmed a relationship between a layout of gas supply lines, an inner diameter of a manifold, the characteristics of a shower plate, etc., in the mixed gas supply device, and a displacement time of gas inside the chamber by an experiment. The present invention has been invented on the basis of the results of the above-described respective experiments by the inventors of the present invention, who provide a mixed gas supply device for a semiconductor manufacturing apparatus that is capable of speeding up gas displacement and preventing backflow and back-diffusion.

First, the inventors of the present invention have defined backflow or back-diffusion of a gas relating to gas displacement in the mixed gas supply device as in the following (I) to (III), and have reviewed measures to suppress the backflow and back-diffusion on the basis of these definitions.

(I): Backflow of Gas at the Time of Simultaneously Opening and Closing Valves:

This is a phenomenon that, when valves of a plurality of lines are simultaneously opened and closed, a gas of a line whose valve is opened flows into the upstream side of a valve of a line closed, to be enclosed.

(II): Backflow at the Time of Opening a Valve:

This is phenomenon that, when the valve is opened in order to add another gas to a gas flowing in a steady state, the other gas flows into the upstream side of a line in which the gas flows (this temporarily flows back, but is gradually pushed out).

(III): Back-Diffusion of Gas:

This is a phenomenon that, when a plurality of gases are simultaneously made to flow, a gas in a high flow rate line diffuses to get into a low flow rate line.

Because the backflow of gas caused at the time of simultaneously opening and closing the valves in the aforementioned definition (I) is basically a phenomenon caused because of the existence of an instance in which both valves are simultaneously open at the time of simultaneously opening and closing the valves, in which this phenomenon relates to the valve opening and closing operating characteristics. In order to prevent backflow, it is necessary to provide a temporal difference (delay time) between opening and closing of the both valves. For example, in the case of using pneumatically operated metal diaphragm valves (the type manufactured by Fujikin Incorporated) as the valves, although there is a difference depending on a configuration of an operational air pressure supply system, it has been confirmed that, in the case where a length of an air pressure tube is 1000 mm, its outer diameter is 3 mmφ, and a supply pressure is 0.4 to 0.6 MPa, it is possible to completely prevent the backflow in the aforementioned phenomenon (I) by providing a delay time of approximately 40 msec. An example of a metal diaphragm valve (MDV) and a valve seat (VS) is shown in FIG. 19.

FIG. 1 shows a gas diffusion test device used for reviewing backflow in the aforementioned phenomenon (II) and back-diffusion in the aforementioned phenomenon (III). A back-diffusion phenomenon, in the case where gas Ar and a low flow rate gas He are simultaneously supplied, has been reviewed using a flow rate of a low flow rate line He, a pressure of a manifold portion, a time of simultaneously supplying Ar/He, a flow rate of a high flow rate line Ar, a position (distance) between the Ar and He supply lines, interposing positions of orifices, and the like as parameters, by use of the test device.

In addition, in FIG. 1, the reference symbols $GS_1$ to $GS_4$ denote gas supply ports, the reference symbol RG denotes a pressure regulator, the reference symbol PG denotes a pressure gauge, the reference symbol F denotes a filter, the reference symbols $VS_1$-$VS_4$ denote inlet side valves, the reference symbol FCS denotes a pressure type flow rate control device, the reference symbols $VO_1$ to $VO_4$ denote outlet side switching valves, the reference symbol 1 denotes a manifold (with an inner diameter of 4.4 mmφ), the reference symbol 2 denotes a mixed gas outlet, the reference symbol 3 denotes a mixed gas supply tube (¼"×0.6 m), the reference symbol 4 denotes a regulating valve, the reference symbol 5 denotes a process chamber (39.5 liters), the reference symbol 6 denotes a vacuum pump, the reference symbol 7 denotes a regulating valve, the reference symbol 8 denotes a quadrupole mass spectrometer (Qmass/intake pressure $3.0 \times 10^{-4}$ Pa), the reference symbol 9 denotes a pressure regulator, the reference symbol CM denotes a pressure gauge (capacitance manometer/100 Torr, 1 Torr), the reference symbol 10 denotes a double three-way valve, the reference symbol 11 denotes a personal computer, the reference symbol 12 denotes an electromagnetic valve, the reference symbol 13 denotes a control device (PLC), and the reference symbol 14 denotes an air tube (inner diameter of 2.5 mm×1 m).

A supply pressure to the gas supply port GS is 250 kPaG, and metal diaphragm valves are used as the inlet side valves VS and the outlet side switching valves VO.

As a result of tests, it has become clear that: (a) Back-diffusion easily occurs when a high flow rate line into which a gas is made to simultaneously flow is located on the upstream of a low flow rate line; (b) Back-diffusion is increased when a flow rate of a low flow rate line is 7 sccm or less; (c) Back-diffusion easily occurs when a pressure of the manifold portion is high; and the like. Furthermore, in order to suppress back-diffusion, it has become clear that: a. a low flow rate line is provided so as to be separated as far as possible from the high flow rate line into which a gas is made to simultaneously flow; b. a flow rate of a low flow rate gas is set to 10 sccm or more; c. a pressure of the manifold portion is lowered; d. the orifices have significant back-diffusion prevention effects; and the like.

Although most of the above-described respective test results have been suspected in view of the conventional well-known technologies, it has become clear that the orifices specifically have significant back-diffusion prevention effects through the processes of the tests. Therefore, the inventors of the present invention have continuously reviewed the relationship between orifice interposing locations and back-diffusion prevention effects.

FIG. 2 shows interposing positions of orifices in a mixed gas supply device intended for consideration. Under the condition that a purge He gas was supplied to the gas supply port $GS_1$, an Ar gas was supplied at 140 sccm to the high flow rate line gas supply port $GS_4$, a He gas was supplied at 1 to 10 sccm to a low flow rate line gas supply port $GS_5$, the inlet side valves $VS_1$ to $VS_3$ were closed, the valves $VS_4$ and $VS_5$ were open, the outlet side valves $VO_1$ to $VO_3$ were closed, the valves $VO_4$ and $VO_5$ were open, and the pressure of the manifold 1 is set to 100 Torr, the He and Ar gases were simultaneously supplied for one minute. Thereafter, the valves $VO_4$ and $VO_5$ were closed, the valves $VS_1$ and $VO_4$ were opened, and the interfluent portion was sufficiently purged with He, and thereafter, the valve $VO_1$ was closed and the valve $VO_5$ was opened, the He gas in the low flow rate line was led into the Qmass 8 of FIG. 1, and an Ar ion concentration in the He gas was measured. The arrow in FIG. 2 showing flow from $VO_4$ to $VO_5$ represents back-diffusion or back flow. In addition, the orifice interposing positions were changed to the three places of a downstream side A of the outlet side valve $VO_5$, an upstream side B of the outlet side valve $VO_5$, and an upstream side C of the flow rate control device FCS, and an Ar ion concentration was measured in each of the cases.

FIG. 3 shows the results of the back-diffusion test of the Ar. The curve line "a" shows the case where the orifice is interposed at the position A of FIG. 2, the curve line "b" shows a case where the orifice is interposed at the position B, and the curve line "c" shows a case where the orifice is interposed at the position C. It has become clear, based on this test, that it is most effective for back-diffusion prevention and backflow prevention to provide an orifice on a downstream side of an outlet side valve VO.

In addition, the reason that the pressure type flow rate control device FCS is used as a flow rate control device for a high flow rate gas line in the test device of FIG. 2 is for diverting the gasket type orifice provided on the outlet side of the FCS as the orifice C. As a matter of course, the orifice C may be interposed on the downstream side (the outlet side) by use of the thermal type flow rate control device MFC in the same way as the low flow rate gas line.

Furthermore, in FIG. 2, the low flow rate gas line is disposed on the downstream side (at an interval of approximately 40 mm) so as to be just proximal to the high flow rate gas line. However, it has become clear that it is possible to effectively prevent back-diffusion of the high flow rate gas to the inside of the low flow rate gas line by disposing the orifice on the downstream side of the outlet side valve $VO_5$ even in such a layout relationship of gas supply lines.

Next, the inventors of present invention prepared a test device using a mixed gas supply device as shown in FIG. 4 in order to obtain basic data on gas displacement in a mixed gas supply device, and reviewed gas displacement characteristics in a chamber under various gas supply conditions, which will be described later by use of the test device of FIG. 4.

In addition, in FIG. 4, the same members as in the case of FIG. 1 are denoted by the same reference symbols, and only the fact that the mixed gas supply tube 3 is ⅜"×1.2 m, and the fact that a pseudo shower plate SP is interposed inside the mixed gas supply tube 3, are mainly different between the testing embodiments. That is, this pseudo shower plate SP is substituted for the function of the shower plate installed inside a process chamber 5, and the pseudo shower plate SP whose internal capacity is 137.8 cc, to be capable of regulating its pressure to 3, 50, and 100 Torr, is used.

First, a process gas Ar was supplied from the gas supply port $GS_1$ and a carrier gas $N_2$ was supplied from the gas supply port $GS_4$, respectively, according to gas supply sequences as shown in FIG. 5, and the gas displacement inside the chamber 5 was measured by the quadrupole mass spectrometer 8 installed in the chamber 5 (whose internal capacity is 39.5 liters).

The measurements were respectively performed using the inner pressures (3 Torr, 50 Torr, 100 Torr) of the pseudo shower plate SP, the inner diameters (4.4 mmφ, 10 mmφ) of the manifold 1, and the flow rates (3 sccm, 5 sccm, 10 sccm) of the process gas Ar as parameters, and results as shown in FIG. 6 (when the inner diameter of the manifold 1 is 4.4 mmφ) and FIG. 8 (when the inner diameter of the manifold 1 is 10 mmφ) were obtained.

As is clear from the test results of the gas displacement characteristics of FIG. 6 and FIG. 8, it has become clear that: a. when the pressure of the pseudo shower plate SP is increased, it takes time to fill the upstream pipework including the shower plate and the manifold 1, which results in a long time for gas displacement inside the chamber 5; b. in the case where the low flow rate gas line is on the upstream of the carrier gas line, a gas displacement time changes depending on a flow rate of the low flow rate process line; and the like.

Next, as shown in FIG. 4, the same test was carried out with respect to the case where the low flow rate gas line Ar was supplied from the gas supply port $VO_4$, and the carrier gas $N_2$ was supplied from the gas supply port $VO_1$. FIG. 7 (the inner diameter of the manifold 1 is 4.4 mmφ) and FIG. 9 (the inner diameter of the manifold 1 is 10 mmφ) show the results, and it has become clear that, when the pressure of the pseudo shower plate SP is increased, it takes a long time for gas displacement inside the chamber 5, and the time required for gas displacement inside the chamber does not depend on the flow rate of the low flow rate gas line when the low flow rate line is on the downstream of the high flow rate line.

The inventors of the present invention have conceived of an idea from the results of the respective tests, namely that, in the mixed gas supply device for a semiconductor manufacturing apparatus, a low flow rate gas supply line is disposed so as to be just proximal to a mixed gas outlet, and an orifice for back-diffusion prevention having an appropriate caliber is interposed at the end of the gas outflow port of the outlet side switching valve VO of the low flow rate gas supply line, or a part of a passage cross-sectional area of the outlet side gas passage of the flow rate control device is narrowed in place of the orifice, to prevent backflow and back-diffusion of gas. Thus, the inventors of the present invention have conceived that it is possible to perform gas displacement at high speed and to prevent gas back-diffusion, whereby it is possible to respond to an increase in gas supply lines, and growth in size and complexity of the shower plate, and the inventors of the present invention have invented the mixed gas supply device according to the present invention on the basis of the inventive concept.

That is, according to a first aspect of the present invention, a basic configuration of the invention provides a mixed gas supply device including a plurality of gas supply lines composed of flow rate control devices and outlet side switching valves VO, wherein the plurality of gas supply lines are arranged in parallel, in which gas outlets of the respective outlet side switching valves VO are communicated with a manifold 1, and a gas supply line at a position close to a mixed gas outlet of the manifold 1 is made for supply of a low flow rate gas, wherein an outlet side of the flow rate control device and an inlet side of the outlet side switching valve VO are hermetically connected via an outlet side connecting fitting 22 of the flow rate control device and a mounting table 19 having a gas flow passage 19a, wherein a small hole portion 26 is provided at a part of a flow passage 24 at the outlet side connecting fitting 22 and/or a flow passage 25, which makes the outlet side switching valve VO and a mixed gas flow passage 20 in the manifold 1 communicate with one another, and it is possible to prevent back-diffusion of another gas to an upstream side of the outlet side switching valve VO or an upstream side of the flow rate control device, and to perform gas displacement at high speed in a process chamber 5 connected to the mixed gas outlet 2 of the manifold 1.

According to a second aspect of the present invention, in the first aspect of the present invention, a flow rate range variable type pressure type flow rate control device is used as the flow rate control device, a flow passage 28 of the outlet side connecting fitting 22 is formed from a large diameter horizontal passage 29a, a small diameter horizontal passage 29b, and a small diameter vertical passage 28a making those communicate with one another, and the small hole portion 26 is provided at a part of the small diameter vertical passage 28a.

According to a third aspect of the present invention, in the first aspect of the present invention, a flow rate range variable type pressure type flow rate control device is used as the flow rate control device, a flow passage 28 of the outlet side connecting fitting 22 is formed from a large diameter horizontal passage 29a, a small diameter horizontal passage 29b, and a large diameter vertical passage 28b so as to make those communicate with one another, and the small hole portion 26 is provided at a part of the small diameter horizontal passage 29b.

According to a fourth aspect of the present invention, in the first aspect, the second aspect, or the third aspect of the present invention, a process chamber 5 provided with a shower plate SP is used as the process chamber 5 connected to the mixed gas outlet 2.

According to a fifth aspect of the present invention, in the first aspect, the second aspect, or the third aspect of the present invention, a pneumatically operated valve that causes a metal diaphragm valve element to come close to and separate from a valve seat is used as the outlet side switching valve VO.

According to a sixth aspect of the present invention, a basic configuration of the invention provides a mixed gas supply device including a plurality of gas supply lines composed of flow rate control devices and outlet side switching valves VO, wherein the plurality of gas supply lines are arranged in parallel, in which gas outlets of the respective outlet side switching valves VO are communicated with a manifold 1, and a gas supply line at a position close to a mixed gas outlet of the manifold 1 is made for supply of a low flow rate gas, wherein an outlet side of the flow rate control device of the low flow rate gas supply line and an inlet side of the outlet side switching valve VO are hermetically connected via an outlet side connecting fitting 22 of the flow rate control device and a mounting table 19 having a gas flow passage 19a, a gas outlet side passage 27 of the outlet side switching valve VO and the manifold 1 are hermetically connected by providing a back-diffusion prevention orifice 30 between an outlet side end of the gas outlet side passage 27 of the outlet side switching valve VO and an inlet side of a gas flow passage 25 communicated with a mixed gas flow passage 20 of the manifold 1, and it is possible to prevent back-diffusion of another gas to an upstream side of the outlet side switching valve VO, and to perform gas displacement at high speed in a process chamber 5 connected to the mixed gas outlet 2 of the manifold 1.

According to a seventh aspect of the present invention, in the sixth aspect of the present invention, a flow rate range variable type pressure type flow rate control device including a high flow rate orifice $OL_1$ and a low flow rate orifice $OL_2$ is used as the flow rate control device, a flow rate control range of the flow rate control device is 3 sccm to 2000 sccm, and an inner diameter of the orifice 30 is set to 0.6 mm$\phi$.

According to an eighth aspect of the present invention, in the sixth aspect of the present invention, a gasket type orifice is used as the orifice 30.

According to a ninth aspect of the present invention, in the sixth aspect, the seventh aspect, or the eighth aspect of the present invention, a process chamber 5 with a shower plate SP is used as the process chamber 5 connected to the mixed gas outlet 2.

According to a tenth aspect of the present invention, in the sixth aspect, the seventh aspect, or the eighth aspect of the present invention, a pneumatically operated valve that causes a metal diaphragm valve element to come close to and separate from a valve seat is used as the outlet side switching valve VO.

Effects of the Invention

In the present invention, the supply line for a low flow rate process gas is provided at a position close to the mixed gas outlet 2 of the manifold of the mixed gas supply device, and the supply line for a high flow rate gas is provided on the upstream side of the mixed gas outlet 2, i.e., at a position distant from the mixed gas outlet 2. Therefore, as compared with the case where the low flow rate process gas supply line is provided on the upstream side of the supply line for a high flow rate gas, i.e., at a position distant from the mixed gas outlet 2 in the conventional art, it is possible to more rapidly perform gas displacement of the manifold portion. As a result, even when the pressure of the shower plate SP portion is increased, that is, even when the shower plate grows in size, it is possible to shorten a gas displacement time in the process chamber, which significantly improves semiconductor productivity and gas utilization efficiency.

Furthermore, the small hole portion 26 is provided at the flow passage 24 at the outlet side connecting fitting 22 of the pressure type flow rate control device, and back-diffusion of a gas into the main body of the pressure type flow rate control device FCS is effectively prevented by the small hole portion 26. As a result, it is possible to effectively prevent back-diffusion of a gas without causing a significant pressure loss to lower the control characteristics of the pressure type flow rate control device FCS, and additionally, because no orifice is used, it is possible to simplify the structure of the mixed gas manufacturing apparatus, and to make assembling thereof easy.

Moreover, the gasket type orifice 30 is provided between the outlet side end of the gas outlet side passage 27 of the outlet side switching valve VO and the inlet side portion of the gas flow passage 25 communicated with the mixed gas flow passage 20 of the manifold 1, to effectively prevent the gas going toward the upstream side of the outlet side switching valve VO.

As a result, even if the supply line for a low flow rate process gas is provided at a position close to the mixed gas outlet 2 of the manifold, there is no back-diffusion of a gas into the gas outlet side passage 27 of the outlet side switching valve VO, so it is possible to significantly shorten a gas switching time, and it is possible to simplify the structure of the mixed gas manufacturing apparatus, and to make assembling thereof easy.

BRIEF DESCRIPTIONS OF THE DRAWINGS

DETAILED DESCRIPTION OF THE INVENTION (MODE FOR CARRYING OUT THE INVENTION)

Figure 1:
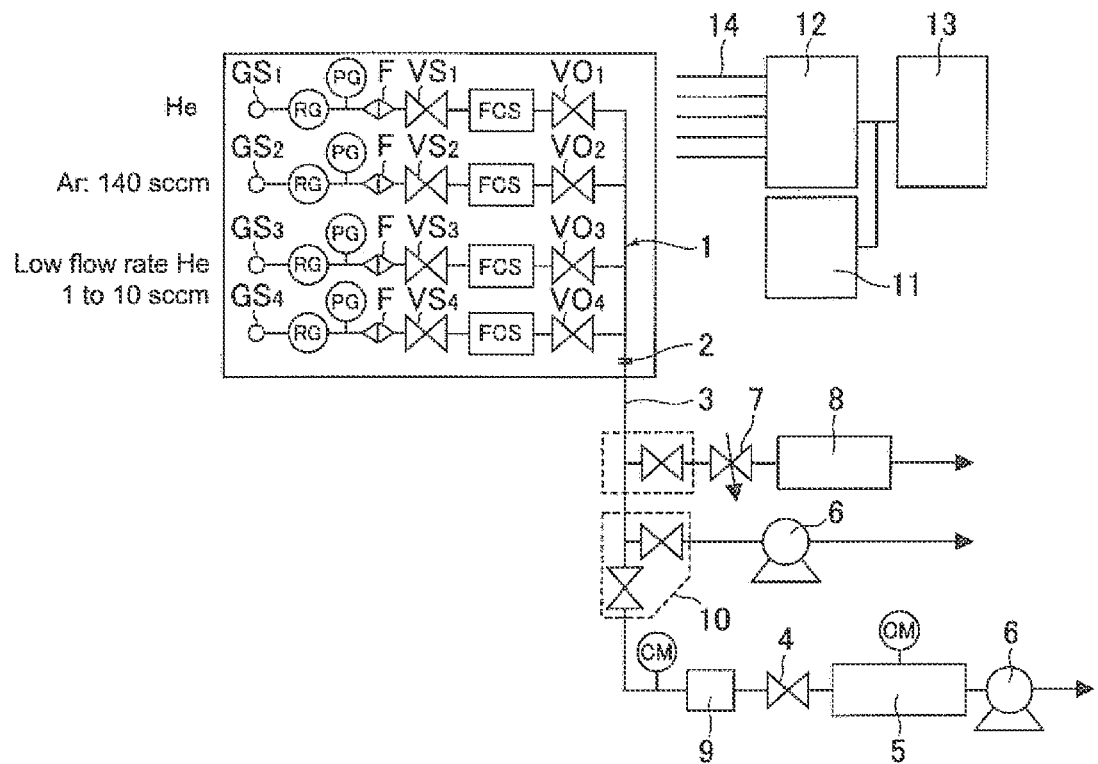
FIG. 1 is a block system diagram of a gas diffusion test device used for a fundamental experiment relating to back-flow and back-diffusion of a gas, as conducted by the inventors.
Figure 2:
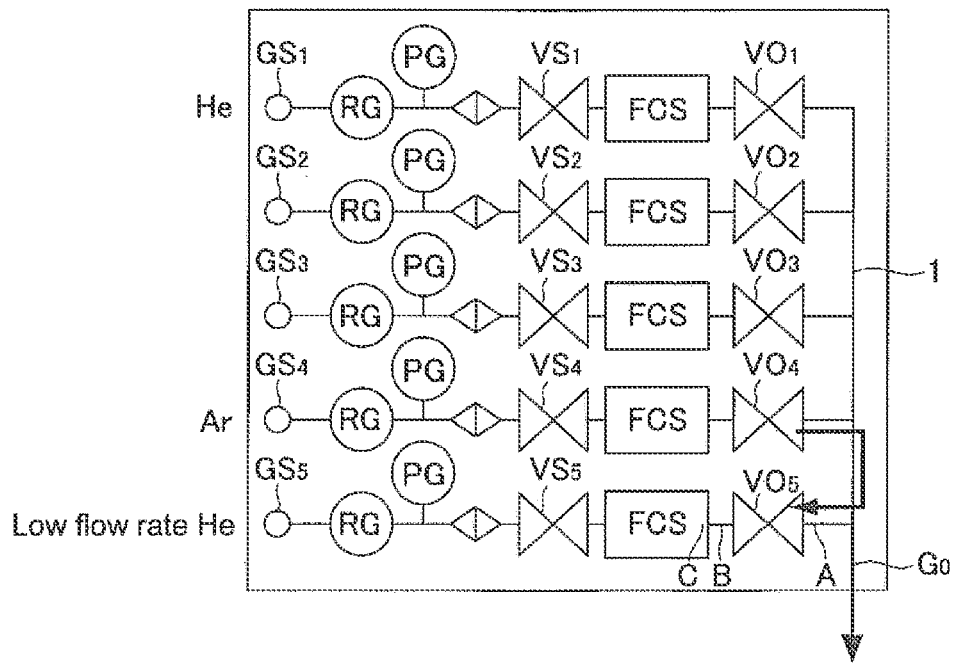
FIG. 2 is a diagram showing orifice interposing positions in a mixed gas supply device in a test for orifice interposing positions and back-diffusion prevention effects.
Figure 3:
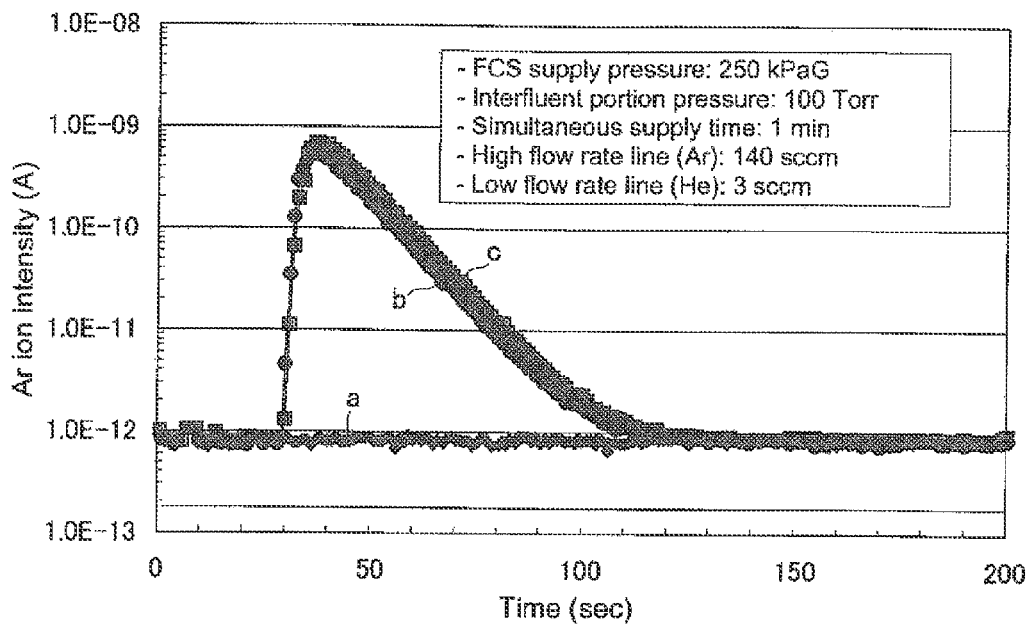
FIG. 3 shows results of Ar back-diffusion tests by the test device of FIG. 2.
Figure 4:
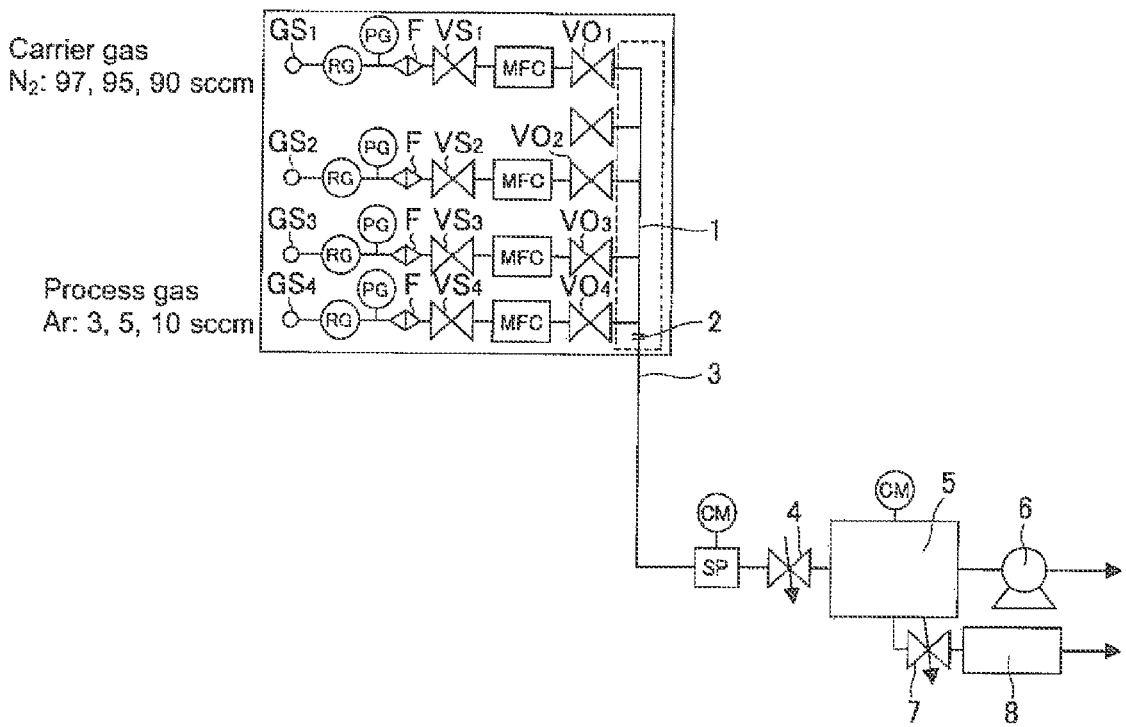
FIG. 4 is a block system diagram of a test device used for a fundamental test for gas displacement characteristics, as conducted by the inventors.
Figure 5:
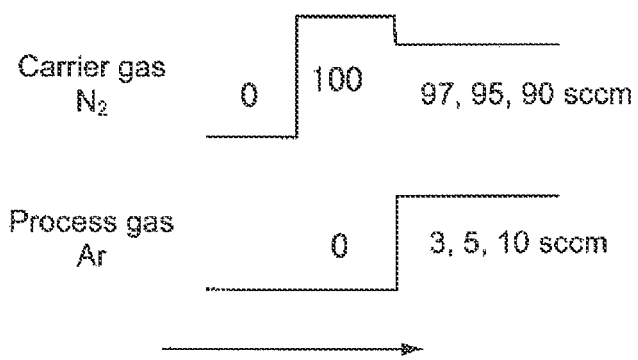
FIG. 5 shows sequences for supplying a carrier gas $N_2$ and a process gas Ar in the test of FIG. 4.
Figure 6:
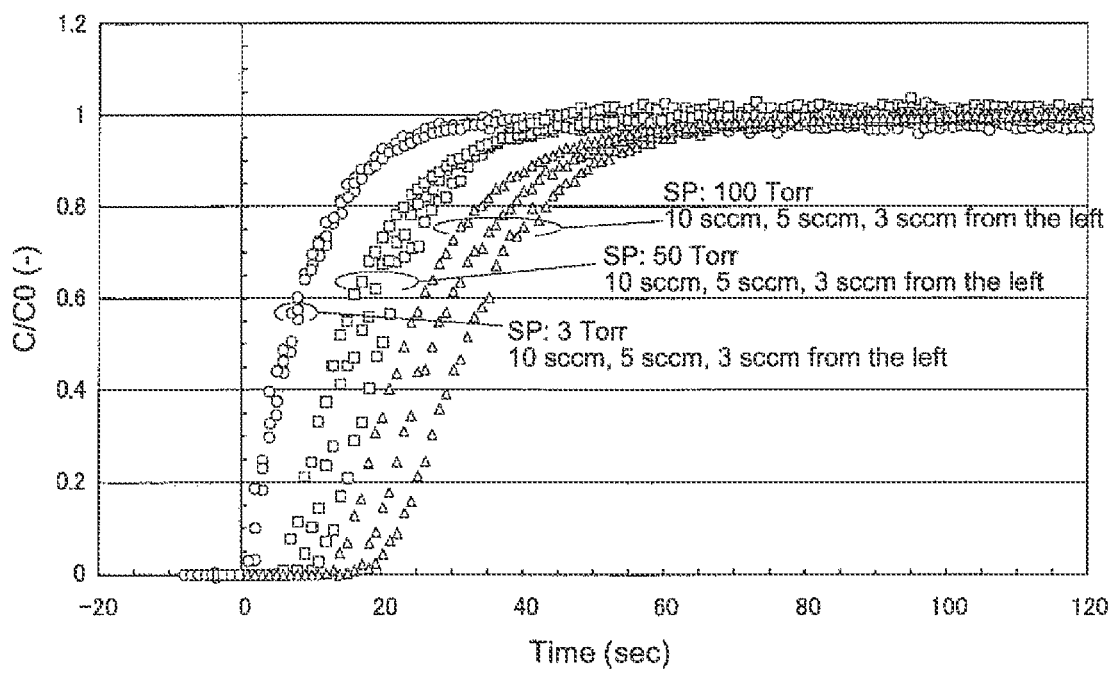
FIG. 6 shows gas displacement characteristics in the case where an inner diameter of a manifold is 4.4 mmϕ (i.e., the low flow rate Ar line is on the upstream of the carrier gas line).
Figure 7:
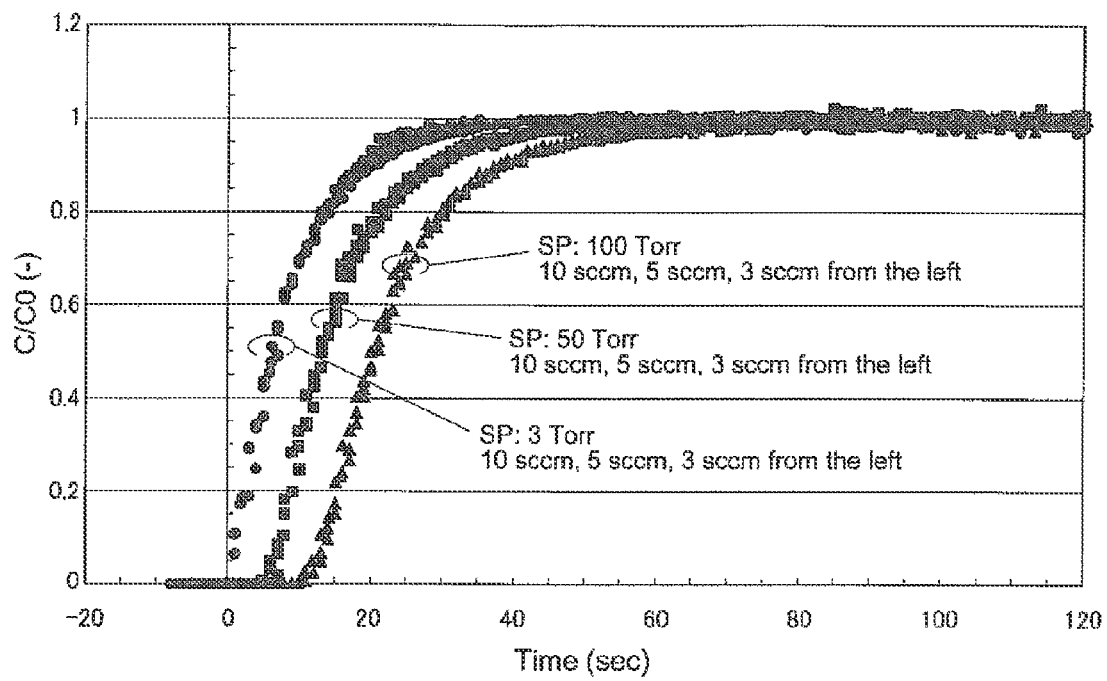
FIG. 7 shows gas displacement characteristics in the case where the low flow rate gas line is on the downstream side of the manifold (i.e., the low flow rate Ar line is on the downstream of the carrier gas line).
Figure 8:
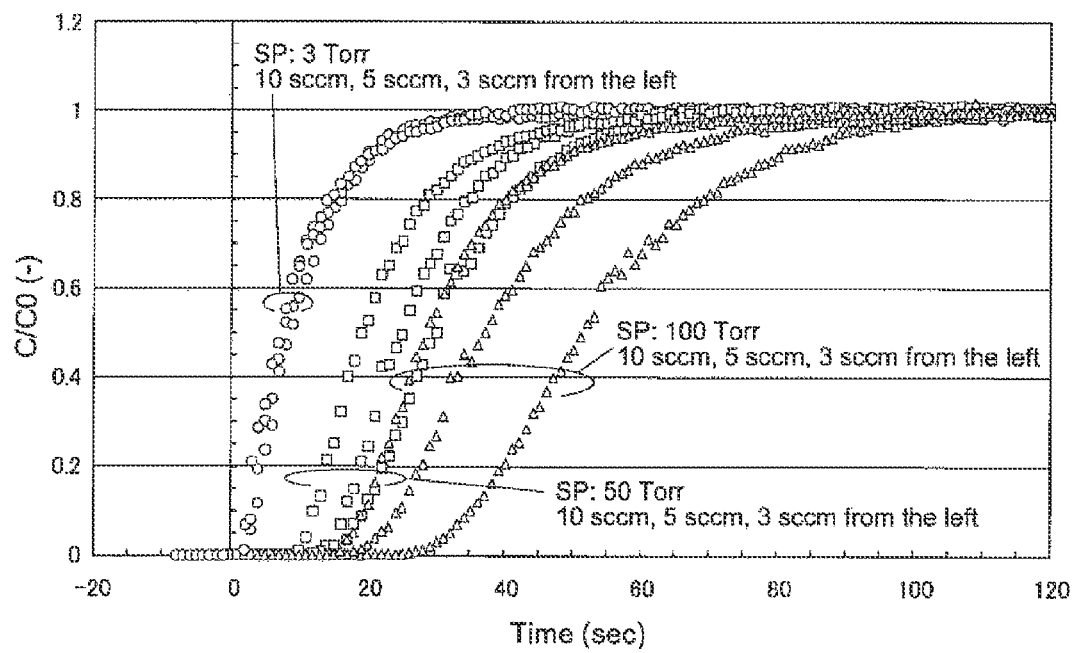
FIG. 8 shows gas displacement characteristics in the case where an inner diameter of the manifold is 10 mmϕ (i.e., the low flow rate Ar line is on the upstream of the carrier gas line).
Figure 9:
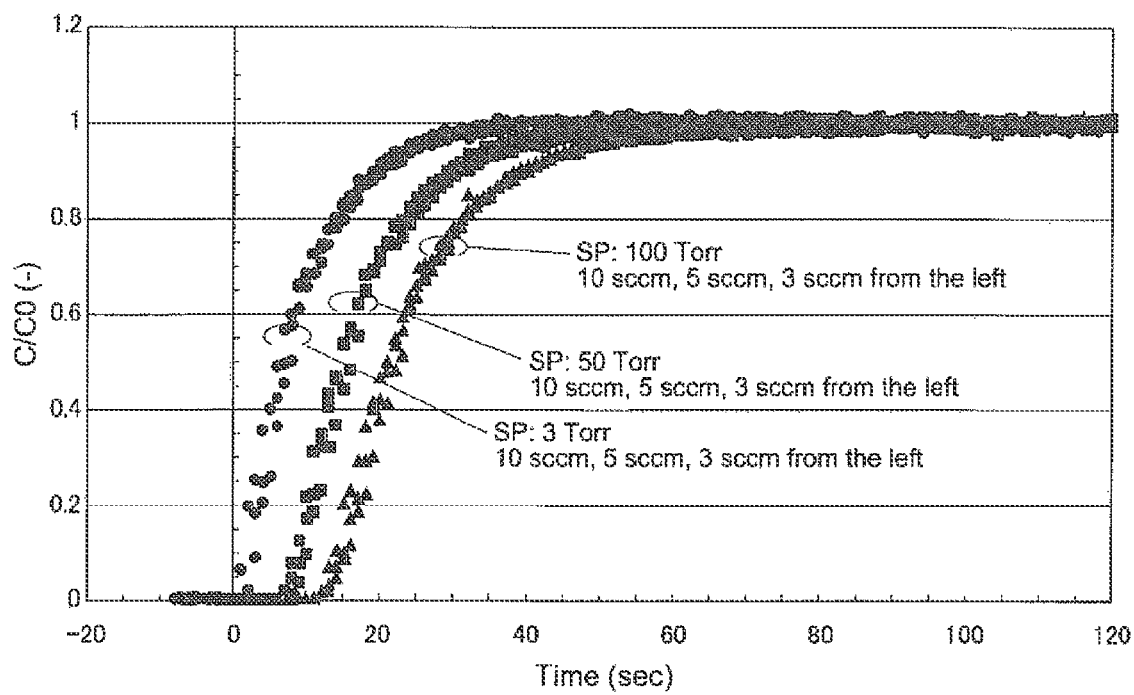
FIG. 9 shows gas displacement characteristics in the case where the low flow rate gas line is on the downstream side of the manifold (i.e., the low flow rate Ar line is on the downstream of the carrier gas line).
Figure 10:
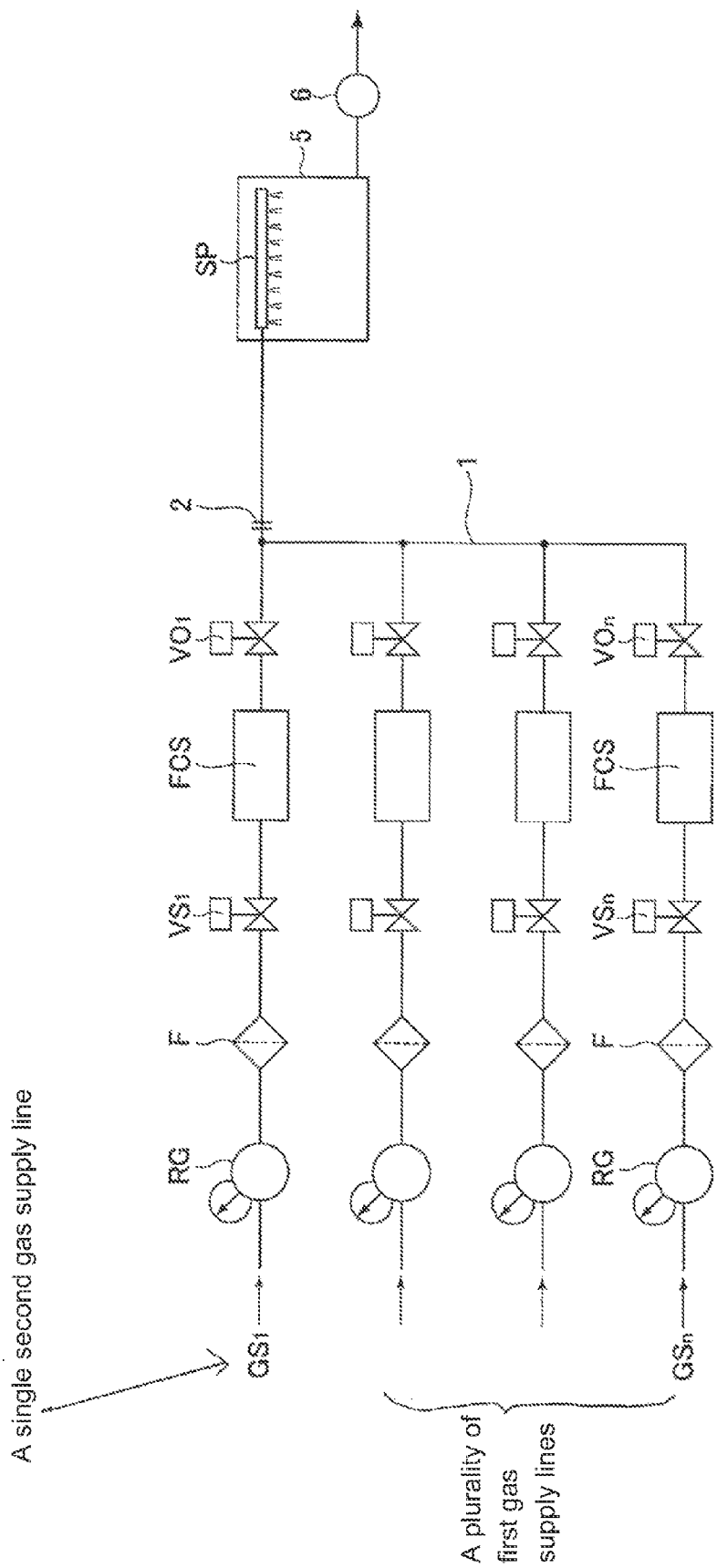
FIG. 10 is a system diagram of a mixed gas supply device according to a first embodiment of the present invention.
Figure 11:
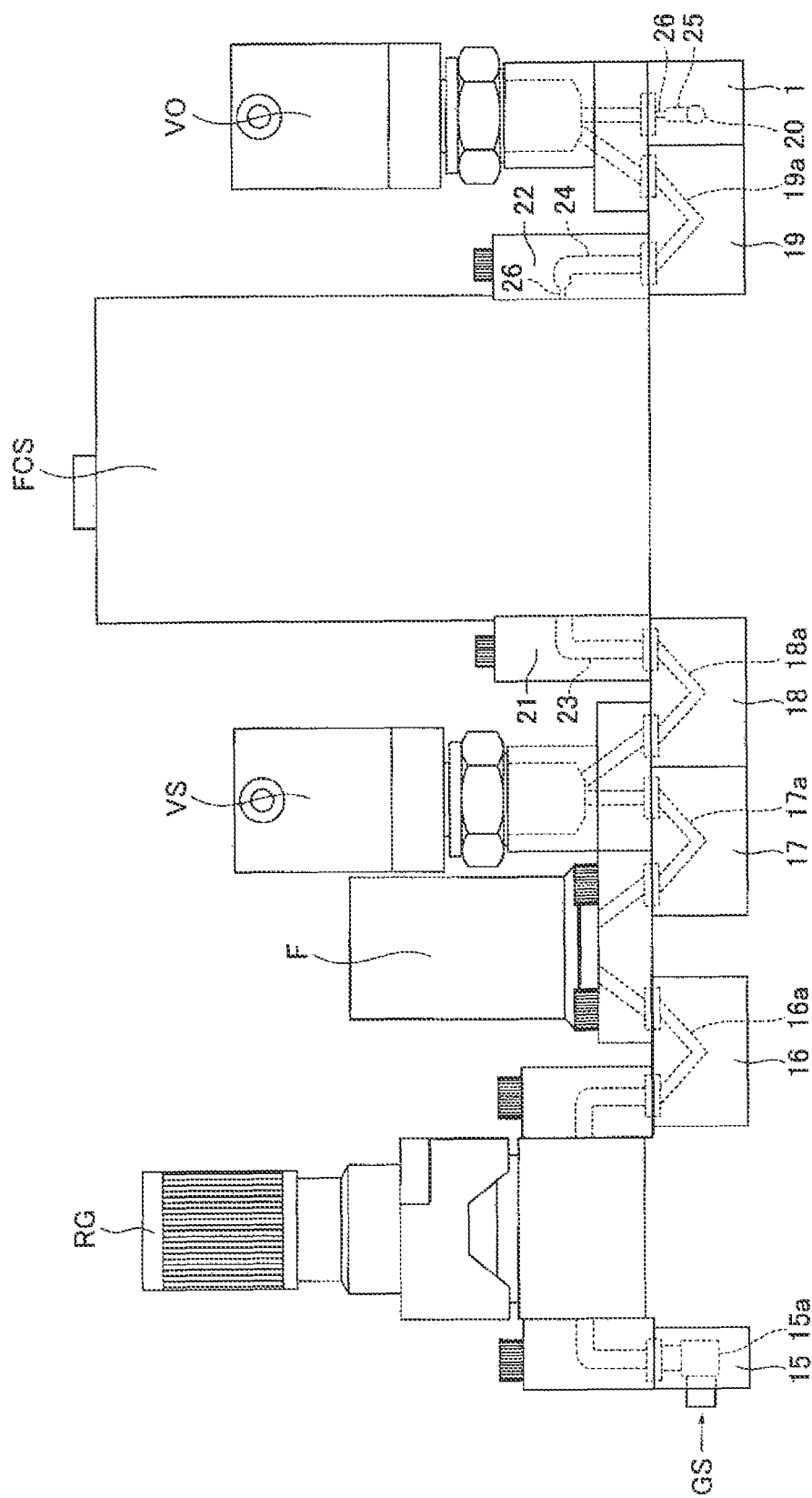
FIG. 11 is a front schematic diagram of the mixed gas supply device shown in FIG. 10.

FIG. 10 is a system diagram of a mixed gas supply device according to a first embodiment of the present invention, and FIG. 11 is a front schematic diagram thereof. In FIGS. 10 and 11, the reference symbols $GS_1$ to $GS_n$ denote gas supply ports, the reference symbol RG denotes a pressure regulator, the reference symbol F denotes a filter, the reference symbols $VS_1$ to $VS_n$ denote inlet side valves, the reference symbol FCS denotes a pressure type flow rate control device, the reference symbols $VO_1$ to $VO_n$ denote outlet side switching valves, and the reference symbol 1 denotes a manifold. In addition, in the present embodiment, the pressure type flow rate control device is used as a flow rate control device. However, as a matter of course, a thermal type flow rate control device MFC may be used in place of the pressure type flow rate control device.

Furthermore, the reference symbols 15 to 19 denote mounting tables wherein corresponding symbols 15a to 19a denote flow passages formed in the respective mounting table, the reference symbol 21 denotes an inlet side connecting fitting of the pressure type flow rate control device, and the reference symbol 22 denotes an outlet side connecting fitting. A gas flowing in from the gas supply port GS flows into a main body of the flow rate control device through a flow passage 23 of the inlet side connecting fitting 21, and the gas regulated to have a given flow rate flows into the outlet side switching valve VO through a flow passage 24 of the outlet side connecting fitting 22 and a flow passage 19a of the mounting table 19. Furthermore, the gas flowing out of the outlet side switching valve VO flows into a mixed gas flow passage 20 through a flow passage 25 of the manifold 1, to be supplied to a process chamber from a mixed gas outlet 2. In addition, in FIG. 10, the reference symbol 5 denotes a process chamber, the reference symbol SP denotes a shower plate provided in the process chamber 5, and the reference symbol 6 denotes a vacuum pump.

In the present embodiment, an inner diameter of a portion of a length of at least 1 to 5 mm of the flow passage 25 formed in the manifold 1 of the outlet side switching valve VO is made to be approximately 0.4 mm to 1.2 mm, that is a small hole portion 26, and the small hole portion 26 is substituted for the function of the conventional orifice for back-diffusion prevention. In addition, an approximately 1 to 5 mm length of the small hole portion 26 is optimum, and when it is greater than 5 mm, a pressure loss is increased in the case of a high flow rate, and a secondary side pressure of the pressure type flow rate control device is increased to decrease a flow rate control range. This is the same for an inner diameter of the small hole portion 26, and the inner diameter and length size of the small hole portion 26 must be selected to be values which do not have adverse effects on the control characteristics of the pressure type flow rate control device.

In addition, the respective mounting tables 15 to 19 and the respective devices RG, F, VS, FCS, VO, and the like, are hermetically connected so as to be freely detachable as is well-known, and in the same way, the main body of the pressure type flow rate control devices FCS and the respective connecting fittings 21 and 22 as well are hermetically attached and fixed so as to be freely detachable. Furthermore, because the pressure type flow rate control devices FCS, and the other devices are all well-known, detailed descriptions thereof will be omitted.

In the first embodiment of the invention, even in the case where the low flow rate gas line is disposed on the downstream of the carrier gas line, the gas does not flow back or back-diffuse toward the outlet side switching valve VO due to the small hole portion 26 provided at the flow passage 25 of the manifold 1, and it is possible to perform rapid gas displacement in the chamber without particularly requiring a long gas displacement time, that is, gas displacement by a time constant Z=PV/f (Z is a time constant, P is pressure in chamber, V is a volume in chamber, and f is a total flow rate), which is substantially equal to a theoretical calculation value.

Furthermore, in FIG. 11, the small hole portion 26 is provided at the flow passage 25 of the manifold 1. However, the small hole portion 26 may be provided at a part of the flow passage 24 of the outlet side connecting fitting 22. In this case, it is possible to effectively prevent back-diffusion of the gas into the main body of the pressure type flow rate control device FCS. In the same way, the small hole portion 26 may be provided at a part of the flow passage 19a of the mounting table 19.

Figure 12:
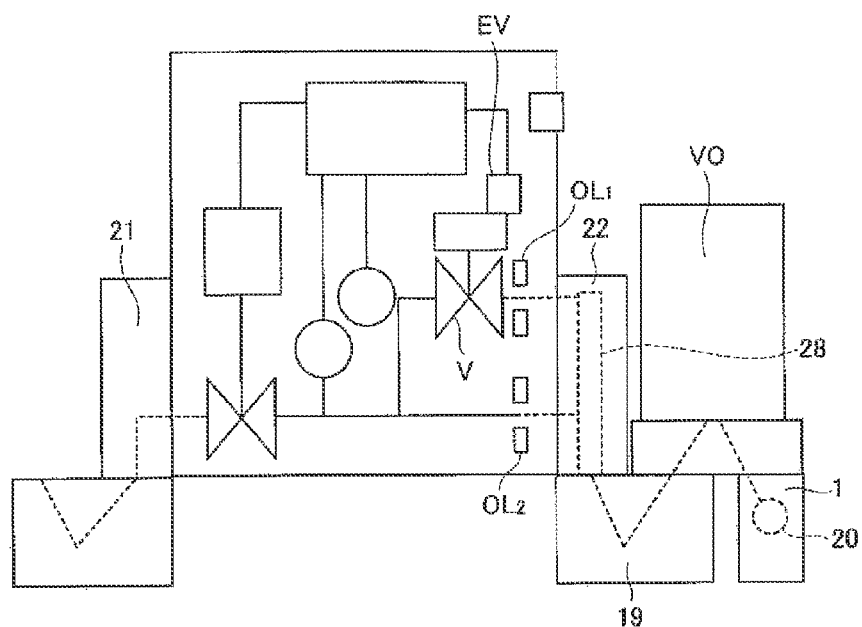
FIG. 12 is a structural drawing of a flow rate range variable type pressure type flow rate control device used in the mixed gas supply device according to the first embodiment and a second embodiment of the present invention.
Figure 13:
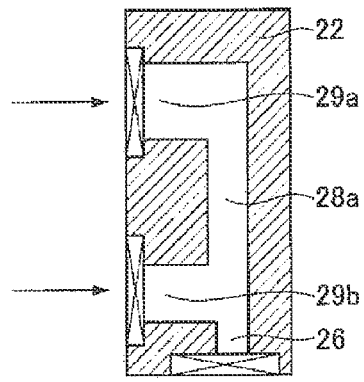
FIG. 13 is a cross-sectional schematic diagram of an outlet side connecting fitting used for the flow rate range variable type pressure type flow rate control device.
Figure 14:
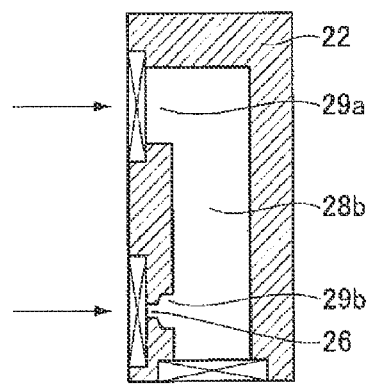
FIG. 14 is a cross-sectional schematic diagram showing another example of an outlet side connecting fitting used for the flow rate range variable type pressure type flow rate control device.

FIG. 12 is a structural drawing of a flow rate range variable type pressure type flow rate control device used in the mixed gas supply device according to the first embodiment of the present invention and a second embodiment, which will be described later, and FIGS. 13 and 14 are cross-sectional diagrams of outlet side connecting fittings thereof. This flow rate range variable type pressure type flow rate control device, except for the outlet side connecting fitting 22, is well-known from Patent Document 6 and Patent Document 7. A high flow rate orifice $OL_1$ and a low flow rate orifice $OL_2$ are provided at the main body, and by operating an electromagnetic valve EV to open and close the valve V, the flow rate range variable type pressure type flow rate control device is switched for a high flow rate (i.e., the gas circulates through the both $OL_1$ and $OL_2$) or for a low flow rate (i.e., the gas circulates through only the $OL_2$), to be utilized.

The outlet sides of the respective orifices $OL_1$ and $OL_2$ of the flow rate range variable type pressure type flow rate control device are connected to a gas passage provided at the connecting fitting 22. That is, the gas passage in the connecting fitting 22 is, as shown in FIGS. 13 and 14, formed from a vertical passage 28a or 28b, a high flow rate horizontal passage 29a communicated with the upper end of the vertical passage 28a or 28b, and a low flow rate horizontal passage 29b communicated with the lower portion of the vertical passage 28a or 28b, and the bottom ends of the vertical passages 28a and 28b are gas outlets.

In the connecting fitting 22 of FIG. 13, the bottom end portion of the vertical passage 28a, i.e., the portion lower than the communicating portion of the low flow rate horizontal passage 29b, has a small caliber whose inner diameter is 0.4 to 1.2 mm (the small hole portion 26), and this portion performs a gas back-diffusion prevention effect in the same way as the small hole portion 26 of FIG. 11, thereby preventing back-diffusion of the gas into the main body of the pressure type flow rate control device.

Furthermore, in the connecting fitting 22 of FIG. 14, an inner diameter of a portion of the low flow rate horizontal passage 29b is formed into a small caliber of 0.4 to 1.2 mmφ (the small hole portion 26), and this portion performs a gas back-diffusion prevention effect in the same way as the small hole portion 26 of FIG. 11.

In addition, the inner diameter and the length size of the small hole portion 26 are the same as those in the case of the first embodiment of FIG. 11, and, as a matter of course, this must be a small hole within a range in which those do not have adverse effects on the control characteristics of the pressure type flow rate control device. In the case of a pressure type flow rate control device whose gas control flow rate is approximately 2000 sccm (standard cubic centimeters per minute), the inner diameter is selected to be approximately 0.4 to 1.2 mmφ, and the length is selected to be approximately 2 to 3 mm.

Figure 15:
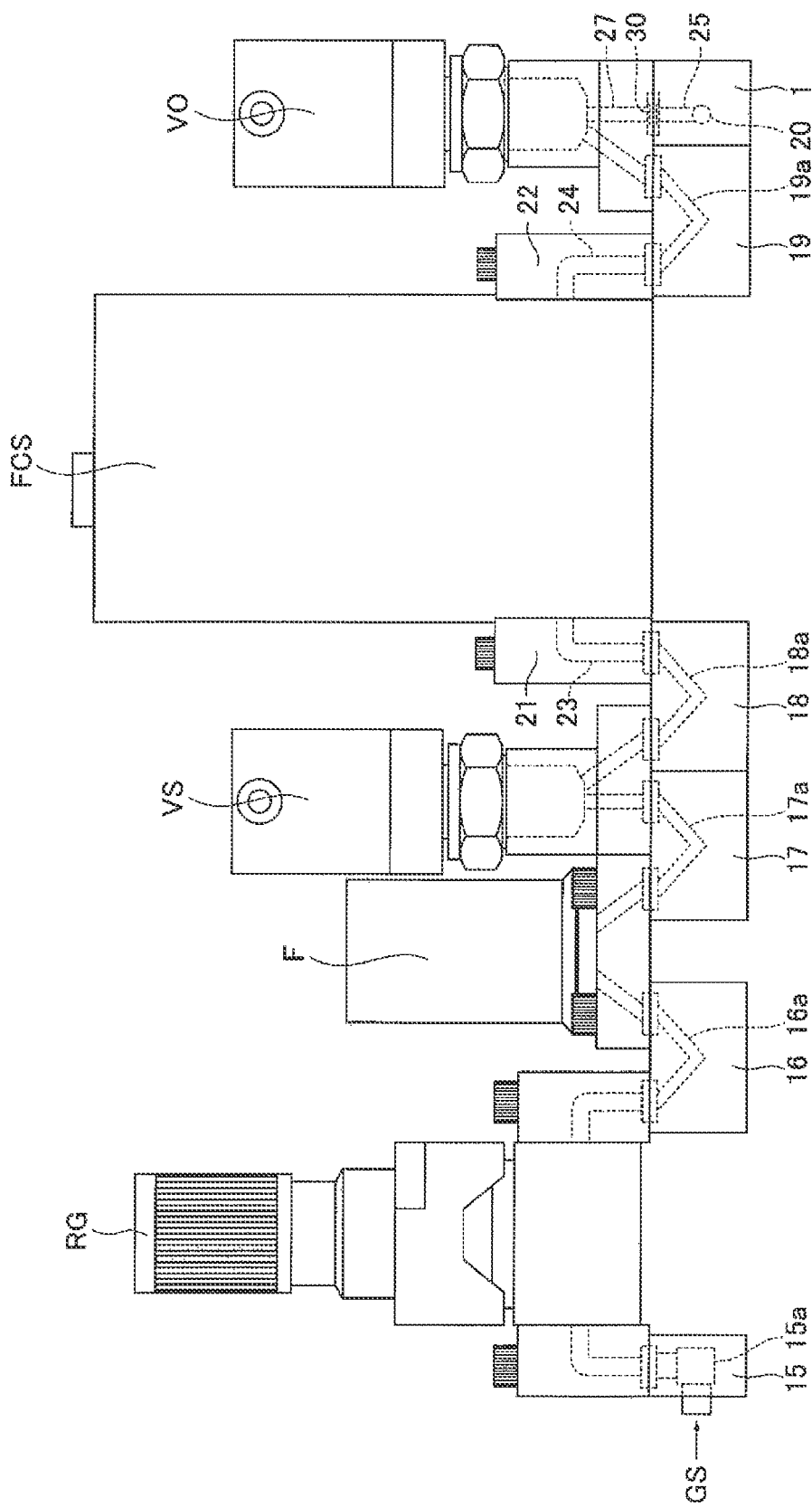
FIG. 15 is a front schematic diagram of the mixed gas supply device according to the second embodiment of the present invention.

FIG. 15 is a front view of a mixed gas supply device according to the second embodiment of the present invention, that is different from the mixed gas supply device according to the first embodiment of FIG. 11 only in the point that (a) no small-diameter portion is provided at the flow passage 24 of the outlet side connecting fitting 22 of the pressure type flow rate control device, and in the point that (b) no small hole portion is provided at the flow passage 25 in the manifold 1, and in the point that (c) a gasket type orifice 30 is interposed between the outlet side end of the gas outlet side passage 27 of the outlet side switching valve VO and the inlet side end of the gas passage 25 in the manifold 1, and the other points are completely the same as those of FIG. 11.

That is, the gasket type orifice 30 is inserted to be attached in a gap located between the outlet side end of the gas outlet side passage 27 of the outlet side switching valve VO and the inlet side end of the gas passage 25 of the manifold 1, and the gasket type orifice 30 is hermetically interposed by sandwiching the main body of the outlet side switching valve VO and the manifold 1 to press fix those components together. In addition, in the second embodiment of FIG. 15, the gasket type orifice 30 is used. However, as a matter of course, an orifice itself may be in any form.

Figure 16:
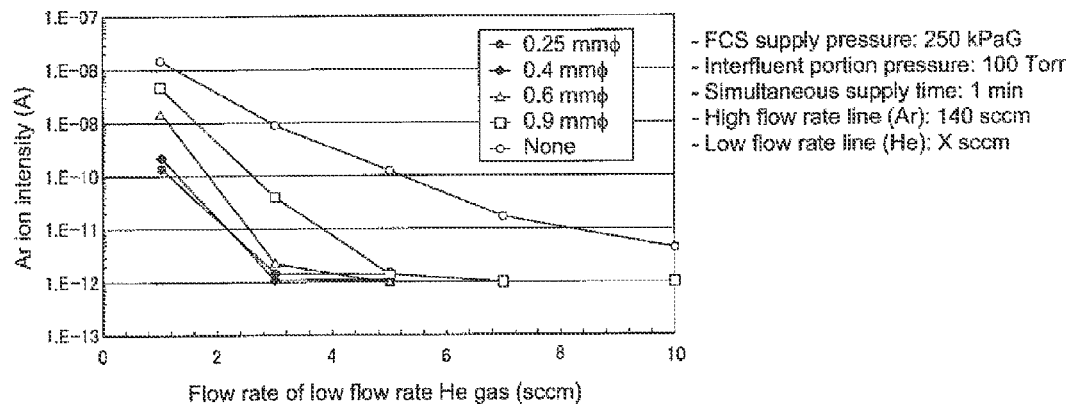
FIG. 16 is a graph showing relationships between a flow rate of a low flow rate He gas and back-diffusion of Ar gas into the He gas using orifice diameters as parameters.

FIG. 16 is a graph showing relationships between a flow rate (sccm) of a low flow rate He gas and back-diffusion of Ar gas into the He gas using sizes of the orifice 30 as parameters. It is understood from FIG. 16 that, in the case where the flow rate of the low flow rate helium gas is approximately 3 sccm or more, back-diffusion into the low flow rate helium gas is prevented by making the caliber of the orifice 30 into 0.6 mmφ or less.

Figure 17:
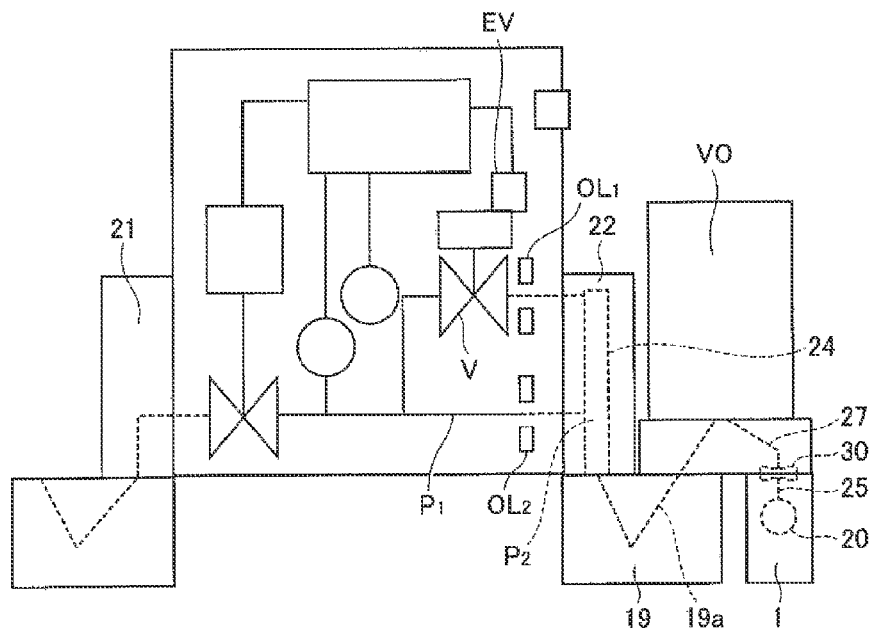
FIG. 17 is an explanatory diagram of the flow rate variable type pressure type flow rate control device used in the mixed gas supply device of FIG. 15.
Figure 18:
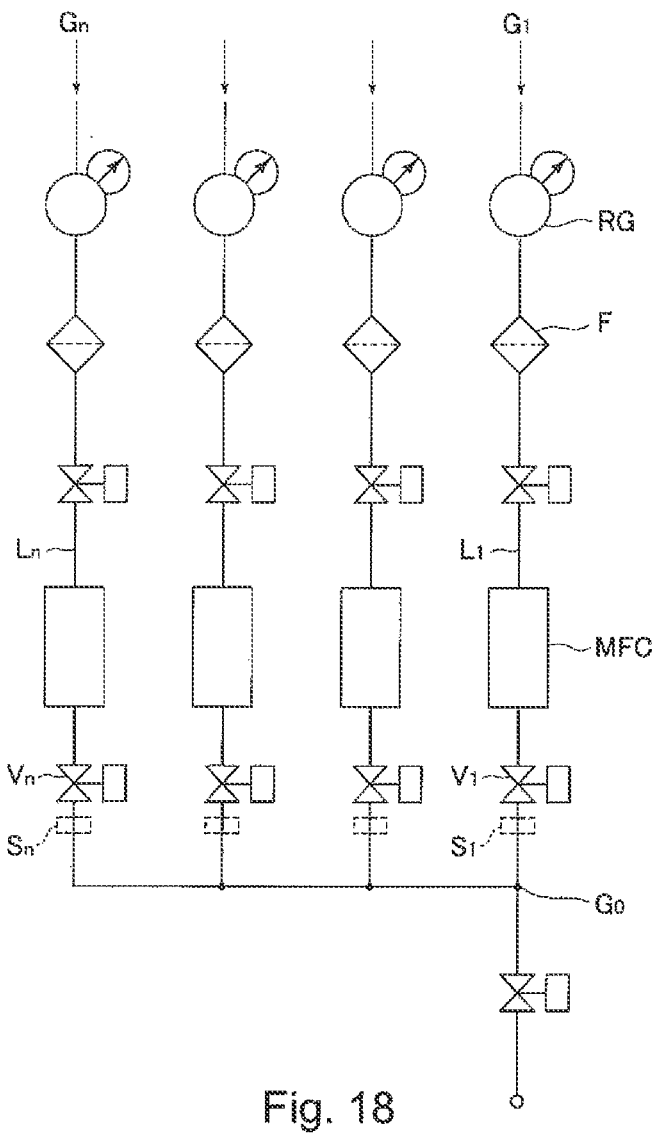
FIG. 18 is a block system diagram of a conventional mixed gas supply device.
Figure 19:
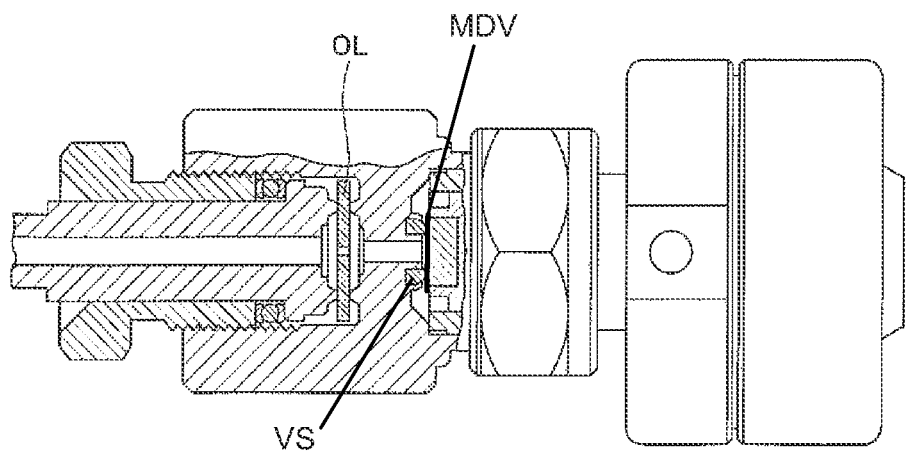
FIG. 19 is a cross-sectional view showing an example of an outlet side switching valve used for the conventional mixed gas supply device.

Table 1 shows actual measurement values of upstream side pressure P1 and downstream side pressure P2 of the orifice $OL_1$, and the caliber of the back-diffusion prevention orifice 30 in the case where the flow rate variable type pressure type flow rate control device shown in FIG. 17 is used as a pressure type flow rate control device in the mixed gas supply device of FIG. 15.

TABLE 1

| Flow rate N2 | P1 (Torr) | P2 (Torr) | | | | |
|---|---|---|---|---|---|---|
| | | No orifice | 0.9 mmφ | 0.6 mmφ | 0.4 mmφ | 0.25 mmφ |
| 2000 | 2250 | 45.0 | 253.0 | 580.0 | 1263.8 | |
| 1600 | 1800 | 37.3 | 203.6 | 465.4 | 1015.3 | |
| 1200 | 1350 | 28.9 | 154.3 | 350.7 | 767.7 | |
| 1000 | 1125 | 24.8 | 129.5 | 293.6 | 643.8 | |
| 800 | 900 | 20.9 | 104.8 | 236.7 | 520.2 | |
| 600 | 675 | 16.4 | 79.9 | 179.9 | 396.4 | |
| 400 | 450 | 13.4 | 54.8 | 122.7 | 27.2 | |
| 200 | 225 | 8.9 | 28.1 | 64.5 | 143.9 | 1742.3 |

As is clear from Table 1, when a flow rate of the pressure type flow rate control device is increased, for example, when a gas flow rate circulating through the large caliber orifice $OL_1$ reaches 2000 (sccm) in the flow rate variable type pressure type flow rate control device of FIG. 17, in the case where the caliber of the back-diffusion prevention orifice 30 is 0.4 mmφ with respect to the upstream side pressure P1 of the orifice $OL_1$=2250 Torr, a drop in pressure is increased, and the downstream side pressure P2 of the orifice $OL_1$ becomes 1263.8 Torr, which makes it impossible to ensure the gas critical expansion condition (P2/P1=0.5 or less) on the orifice $OL_1$. Accordingly, in this case, it is necessary to make the caliber of the orifice 30 into 0.4 mmφ or more (for example 0.6 mmφ). In addition, in the case where the caliber of the orifice 30 is made into 0.6 mmφ, as is clear from FIG. 16, when a flow rate of the low flow rate He gas is 3 sccm or more, an Ar ion intensity indicating back-diffusion reaches a level of $10^{-12}$ (A), and back-diffusion does not occur, that is, it is possible to prevent back-diffusion of the Ar.

It is understood from the measurement results of FIG. 16 and the measurement results of Table 1 that, in the case of a reference gas N2, within a flow rate range of a flow rate of 2000 sccm to 3 sccm, the caliber of the back-diffusion prevention orifice 30 provided at the end of the gas outlet flow passage of the outlet side switching valve VO is preferably made into 0.6 mmφ or more.

In the present invention, even if the supply of a gas at a low flow rate is disposed in the vicinity of the mixed gas outlet, it is possible to effectively prevent back-diffusion of the gas, and a speed of opening and closing the outlet side switching valve is increased to shorten a time in which both valves are simultaneously open to as little as possible, in order to reduce a delay time, whereby it is possible to perform gas displacement in the chamber or the manifold at high speed even in the case where a shower plate capacity is large.

INDUSTRIAL APPLICABILITY

The mixed gas supply device according to the present invention can be applied to all kinds of gas supply devices for semiconductor manufacturing apparatuses.

DESCRIPTION OF SYMBOLS

The reference symbols $GS_1$ to $GS_4$ denote gas supply ports, the reference symbol RG denotes a pressure regulator, the reference symbol PG denotes a pressure gauge, the reference symbol F denotes a filter, the reference symbols $VS_1$ to $VS_4$ denote inlet side valves, the reference symbol FCS denotes a pressure type flow rate control device, the reference symbols $VO_1$ to $VO_4$ denote outlet side switching valves, the reference symbol 1 denotes a manifold, the reference symbol 2 denotes a mixed gas outlet, the reference symbol 3 denotes a mixed gas supply tube, the reference symbol 4 denotes a regulating valve, the reference symbol 5 denotes a process chamber, the reference symbol 6 denotes a vacuum pump, the reference symbol 7 denotes a regulating valve, the reference symbol 8 denotes a quadrupole mass spectrometer (Qmass), the reference symbol 9 denotes a pressure regulator, the reference symbol 10 denotes a double three-way valve, the reference symbol 11 denotes a personal computer, the reference symbol 12 denotes an electromagnetic valve, the reference symbol 13 denotes a control device (PLC), the reference symbol 14 denotes an air tube, the reference symbols 15 to 19 denote mounting tables, the reference symbols 15*a* to 19*a* denote gas flow passages, the reference symbol 20 denotes a mixed gas flow passage of the manifold 1, the reference symbol 21 denotes an inlet side connecting fitting of the pressure type flow rate control device, the reference symbol 22 denotes an outlet side connecting fitting of the pressure type flow rate control device, the reference symbol 23 denotes a flow passage, the reference symbol 24 denotes a flow passage, the reference symbol 25 denotes a flow passage, the reference symbol 26 denotes a small hole portion, the reference symbol 27 denotes an outlet side gas passage of the outlet side switching valve, the reference symbol 28*a* denotes a small diameter vertical passage, the reference symbol 28*b* denotes a large diameter vertical passage, the reference symbol 29*a* denotes a large diameter horizontal passage, the reference symbol 29*b* denotes a small diameter horizontal passage, the reference symbol 30 denotes a back-diffusion prevention orifice, the reference symbol MFC denotes a thermal type flow rate control device, the reference symbol EV denotes an electromagnetic valve, the reference symbol $OL_1$ denotes a high flow rate orifice, the reference symbol $OL_2$ denotes a low flow rate orifice, the reference symbol F denotes a filter, the reference symbol CM denotes a pressure gauge (capacitance manometer), and the reference symbol SP denotes a pseudo shower plate.

The invention claimed is:
1. A mixed gas supply device comprising:
(a) a plurality of first gas supply lines including flow rate control devices and outlet side switching valves, wherein the plurality of first gas supply lines are arranged in parallel, in which gas outlets of the respective outlet side switching valves communicate with a manifold, wherein the plurality of first gas supply lines supply a relatively high flow rate of gas; and
(b) a second gas supply line having a flow rate, the second gas supply line being a single gas line, wherein a gas outlet of the second gas supply line is connected at a position nearer to a mixed gas outlet of the manifold than a gas outlet of any one of the plurality of first gas supply lines such that the flow rate of gas flowing in the second gas supply line is less than the flow rate of gas flowing in any one of the plurality of first gas supply lines,
wherein a gas outlet of the first gas supply line has a maximum flow rate of gas greater than the maximum flow rate of gas among the plurality of first gas supply lines and wherein the gas outlet having the maximum flow rate is connected at a position furthest from the mixed gas outlet of the manifold than any one of the plurality of first gas supply lines,
wherein an outlet side of a flow rate control device of the second gas supply line and an inlet side of a corresponding outlet side switching valve of the second gas supply line are hermetically connected via an outlet side connecting fitting of the flow rate control device of the second gas supply line and a mounting table having a gas passage, wherein a hole portion is provided at a part of a flow passage at the outlet side connecting fitting, or at a flow passage of the manifold, or the hole portion is provided at a part of the flow passage at the outlet side connecting fitting and at the flow passage of the manifold, and arranged to make the outlet side switching valve of the second gas supply line and a mixed gas flow passage in the manifold communicate with one another to prevent back-diffusion of another gas to an upstream side of the outlet side switching valve of the second gas supply line, or to an upstream side of the flow rate control device of the second gas supply line, and a process chamber connected to the mixed gas outlet of the manifold arranged to perform a gas displacement at a speed sufficient to prevent gas back-diffusion.
2. The mixed gas supply device according to claim 1, wherein the process chamber connected to the mixed gas outlet is provided with a shower plate.
3. The mixed gas supply device according to claim 1, wherein the outlet side switching valve of the second gas supply line is a pneumatically operated valve that causes a metal diaphragm valve element to come close to and separate from a valve seat.
4. The mixed gas supply device according to claim 1, wherein the flow rate control device of the second gas supply line is a flow rate range variable type pressure type flow rate control device, and the flow passage of the outlet side connecting fitting comprises a first horizontal passage, a second horizontal passage, and a vertical passage that communicate with one another, and the hole portion is provided at a part of the diameter vertical passage, wherein the hole portion is of sufficient dimensions to prevent gas back-diffusion, wherein the first horizontal passage has a larger diameter than the second horizontal passage and the vertical passage.
5. The mixed gas supply device according to claim 4, wherein the process chamber connected to the mixed gas outlet is provided with a shower plate.

6. The mixed gas supply device according to claim 4, wherein the outlet side switching valve of the second gas supply line is a pneumatically operated valve that causes a metal diaphragm valve element to come close to and separate from a valve seat.

7. A mixed gas supply device comprising:
(a) a plurality of first gas supply lines including flow rate control devices and outlet side switching valves, wherein the plurality of first gas supply lines are arranged in parallel, in which gas outlets of the respective outlet side switching valves communicate with a manifold, wherein the plurality of first gas supply lines supply a relatively high flow rate of gas; and
(b) a second gas supply line having a flow rate, the second gas supply line being a single gas line, wherein a gas outlet of the second gas supply line is connected at a position nearer to a mixed gas outlet of the manifold than a gas outlet of any one of the plurality of first gas supply lines such that the flow rate of gas flowing in the second gas supply line is less than the flow rate of gas flowing in any one of the plurality of first gas supply lines,
wherein a gas outlet of the first gas supply line has a maximum flow rate of gas greater than the maximum flow rate of gas among the plurality of first gas supply lines and wherein the gas outlet having the maximum flow rate is connected at a position furthest from the mixed gas outlet of the manifold than any one of the plurality of first gas supply lines,
wherein an outlet side of a flow rate control device of the second gas supply line and an inlet side of a corresponding outlet side switching valve of the second gas supply line are hermetically connected via an outlet side connecting fitting of the flow rate control device of the second gas supply line and a mounting table having a gas passage, wherein a gas outlet side passage of the outlet side switching valve of the second gas supply line and the manifold are hermetically connected by a back-diffusion prevention orifice provided between an outlet side end of the gas outlet side passage of the outlet side switching valve of the second gas supply line and an inlet side end of a gas passage communicating with a mixed gas flow passage of the manifold to prevent back-diffusion of another gas to an upstream side of the outlet side switching valve of the second gas supply line, and a process chamber connected to the mixed gas outlet of the manifold arranged to perform a gas displacement at a speed sufficient to prevent gas back-diffusion.

8. The mixed gas supply device according to claim 7, wherein the outlet side switching valve of the second gas supply line is a pneumatically operated valve that causes a metal diaphragm valve element to come close to and separate from a valve seat.

9. The mixed gas supply device according to claim 7, wherein the process chamber connected to the mixed gas outlet is provided with a shower plate.

10. The mixed gas supply device according to claim 7, wherein the outlet side switching valve of the second gas supply line is a pneumatically operated valve that causes a metal diaphragm valve element to come close to and separate from a valve seat.

11. The mixed gas supply device according to claim 7, wherein the process chamber connected to the mixed gas outlet is provided with a shower plate.

12. The mixed gas supply device according to claim 11, wherein the outlet side switching valve of the second gas supply line is a pneumatically operated valve that causes a metal diaphragm valve element to come close to and separate from a valve seat.

13. The mixed gas supply device according to claim 7, wherein the back-diffusion prevention orifice is a gasket type orifice.

14. The mixed gas supply device according to claim 13, wherein the process chamber connected to the mixed gas outlet is provided with a shower plate.

15. The mixed gas supply device according to claim 13, wherein the outlet side switching valve of the second gas supply line is a pneumatically operated valve that causes a metal diaphragm valve element to come close to and separate from a valve seat.

* * * * *